United States Patent [19]
Kennan

[11] Patent Number: 5,649,312
[45] Date of Patent: Jul. 15, 1997

[54] MMIC DOWNCONVERTER FOR A DIRECT BROADCAST SATELLITE LOW NOISE BLOCK DOWNCONVERTER

[75] Inventor: Wayne Kennan, Palo Alto, Calif.

[73] Assignee: Fujitsu Limited, Kawasaki, Japan

[21] Appl. No.: 337,842

[22] Filed: Nov. 14, 1994

[51] Int. Cl.[6] .................................................. H04B 1/28
[52] U.S. Cl. .................................... 455/333; 455/343
[58] Field of Search ................................ 327/113, 361, 327/356; 455/333, 313, 317, 318, 319, 323, 325, 3.2, 343, 127

[56] References Cited

U.S. PATENT DOCUMENTS

| | | | |
|---|---|---|---|
| 3,867,707 | 2/1975 | Pering et al. | 329/132 |
| 3,969,681 | 7/1976 | Fincke | 330/56 |
| 4,464,636 | 8/1984 | Dobrovolny | 330/300 |
| 4,484,156 | 11/1984 | Khanna et al. | 331/60 |
| 4,649,354 | 3/1987 | Khanna | 331/99 |
| 4,733,199 | 3/1988 | Khanna | 331/99 |
| 4,737,737 | 4/1988 | Khanna | 331/47 |
| 4,755,772 | 7/1988 | Khanna | 331/109 |
| 4,814,649 | 3/1989 | Young | 455/333 |
| 4,959,873 | 9/1990 | Flynn et al. | 455/3.2 |
| 4,988,959 | 1/1991 | Khanna et al. | 331/117 D |

(List continued on next page.)

FOREIGN PATENT DOCUMENTS

| | | |
|---|---|---|
| 60-020604 | 2/1985 | Japan . |
| 01288004 | 11/1989 | Japan . |
| 3-154506 | 7/1991 | Japan . |
| 5-48320 | 2/1993 | Japan . |

OTHER PUBLICATIONS

Anadigics, Inc., "AKD Series Ku–Band GaAs MMIC Downconverters", *Anadigics Technical Brief*, (Aug. 1990) pp. 1–18.

Anadigics, Inc., "AKD12000 Ku–Band DBS MMIC Downconverter", *Data Sheet*, (Aug. 1990) 2 pages.

Kazukiyo Joshin, Norio Hidaka, and Kohki Hikosaka, "A High–Gain HEMT Monolithic Downconverter for X–Band Direct Broadcast Satellite Applications," *GaAs IC Symposium*, (1993 IEEE) pp. 229–232.

R. Michels, P. Wallace, R. Goyal, N. Scheinberg, and M. Patel, "A High–Performance, Miniaturized X–Band Active Mixer for DBS Receiver Application with On–Chip IF Noise Filter," *IEEE Transactions on Microwave Theory and Technique*, vol. 38, No. 9 (Sep. 1990) pp. 1249–1251.

Vlad Pauker and Michael Binet, "Wideband High Gain Small Size Monolithic GaAs FET Amplifiers," (CH1875–4/83/0000–0081 $1.00 ©1983 IEEE) pp. 81–84.

Raytheon, "RMM9010–01 DBS Downconverter Chip" (Jan. 1992) 2 pages.

P. Wallace, R. Michels, J. Bayruns, S. B. Christiansen, N. Scheinberg, J. Wang, R. Goyal, and M. Patel, "A Low Cost High Performance MMIC Low Noise Downconverter for Direct Broadcast Satellite Reception," *IEEE 1990 Microwave and Millimeter–Wave Monolithic Circuits Symposium*, pp. 7–10.

*Primary Examiner*—Reinhard J. Eisenzopf
*Assistant Examiner*—Nguyen Vo
*Attorney, Agent, or Firm*—Christie, Parker & Hale, LLP

[57] ABSTRACT

A monolithic microwave integrated circuit (MMIC) downconverter for a direct broadcast satellite low noise block downconverter is comprised of a mixer that produces sum and difference frequency signals from an oscillator signal and a radio frequency (RF) signal. An intermediate frequency (IF) signal is obtained by selecting the difference signal of the sum and difference frequency signals using a low pass filter. An active load and amplifier circuit coupled to the low pass filter both provides a DC bias voltage to the mixer that is substantially insensitive to DC current and amplifies the IF signal from the low pass filter. The combined active load and amplifier circuit conserves DC power and reduces the MMiC circuit size, thus reducing the Gallium Arsenide area and therefore, the component cost.

19 Claims, 4 Drawing Sheets

U.S. PATENT DOCUMENTS

| | | | |
|---|---|---|---|
| 5,014,349 | 5/1991 | Kubo et al. | 455/189 |
| 5,027,430 | 6/1991 | Yamauchi et al. | 455/188 |
| 5,047,728 | 9/1991 | Bayruns | 330/277 |
| 5,119,509 | 6/1992 | Kang | 455/328 |
| 5,125,109 | 6/1992 | Geller et al. | 455/313 |
| 5,130,803 | 7/1992 | Kurita et al. | 358/191.1 |
| 5,153,469 | 10/1992 | Petted et al. | 327/113 |
| 5,204,984 | 4/1993 | Fujisaki et al. | 455/319 |
| 5,291,153 | 3/1994 | Shiga | 331/99 |
| 5,303,403 | 4/1994 | Leong | 455/192.3 |
| 5,323,064 | 6/1994 | Bacon et al. | 307/271 |
| 5,325,401 | 6/1994 | Halik et al. | 375/83 |
| 5,355,532 | 10/1994 | Kabo et al. | 455/301 |
| 5,513,390 | 4/1996 | Vice | 455/333 |

MMIC DOWNCONVERTER FOR A DIRECT BROADCAST SATELLITE LOW NOISE BLOCK DOWNCONVERTER

FIELD OF THE INVENTION

This invention relates to Monolithic Microwave Integrated Circuit (MMIC) downconverters used in Low Noise Block Downconverters for Direct Broadcast Satellite (DBS) television transmissions.

BACKGROUND OF THE INVENTION

Direct Broadcast Satellite television transmission receivers comprise a Low Noise Block Downconverter (LNB) mounted on an antenna or satellite dish connected, via coaxial cable, to an indoor tuner attached to a television set or VCR. The LNB is connected to the antenna or dish and converts the satellite signal received by the antenna to a frequency and signal level suitable for processing by the tuner and television or VCR electronics.

The Low Noise Block Downconverter assembly typically includes a monolithic microwave integrated circuit (MMIC) downconverter mounted on a printed circuit board along with support circuitry, additional amplifier stages and filters to provide increased amplification and reduced front end noise. Typically, the LNB Downconverter receives microwave frequencies of approximately 11 GHz to 12 GHz and first amplifies the signals through several high electron mobility transistors (HEMTs) and two amplifier stages in the MMIC. The MMIC also downconverts the RF signals to an intermediate frequency (IF) of approximately 1000 MHz in a mixer, then amplifies the IF signal.

The Direct Broadcast Satellite television market is a large consumer market with sales of many millions of units each year. The market is price sensitive with competitive devices offered by several companies. Reduction of the LNB Downconverter product price is important for a manufacturer to remain competitive in the market. Product price reduction can be achieved through reduction of the component costs, especially the MMIC.

Figure 3:
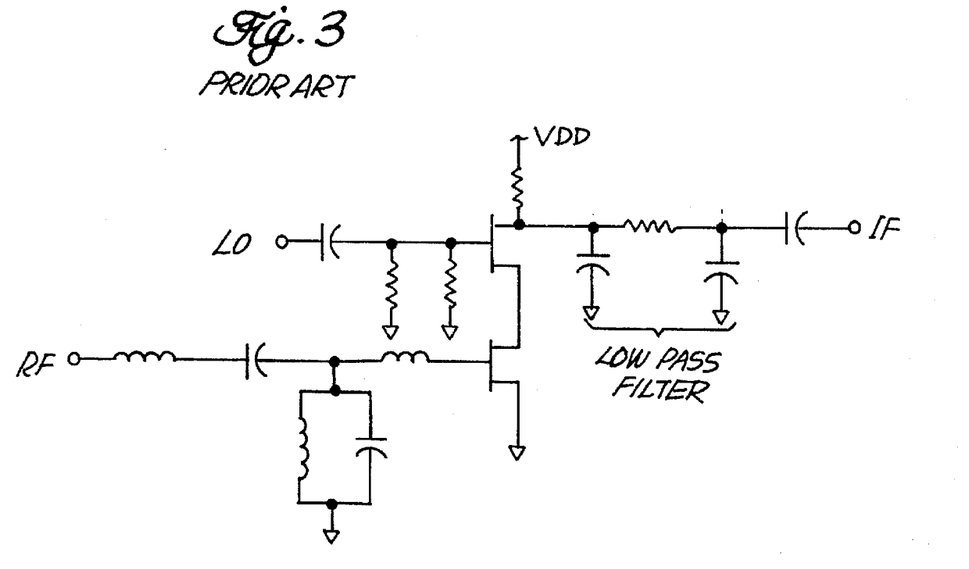
FIGS. 3, 4 and 5 are schematic drawings of prior art circuits.

One design approach, as shown in FIG. 3, is to bias the mixer through a voltage dropping resistor that is separate from the amplification circuitry as discussed in the paper "A High-Performance, Miniaturized X-Band Active Mixer for DBS Receiver Application with On-Chip IF Noise Filter" published in the *IEEE Transactions on Microwave Theory and Techniques,* Vol. 38, No. 9, dated September 1990. This approach yields a mixer bias voltage that is sensitive to DC bias current and additional power dissipation in the bias resistor.

Figure 4:
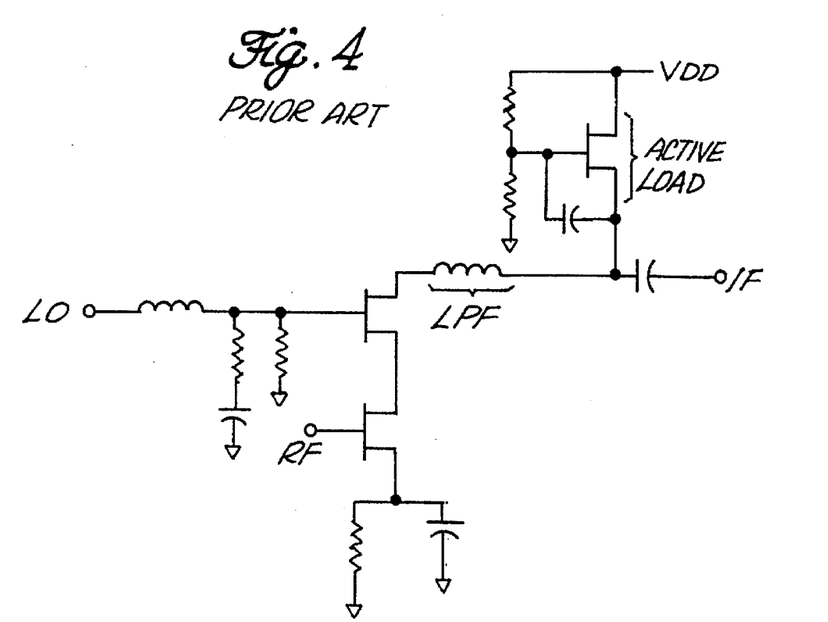

Another design, as shown in FIG. 4, utilizes an active load to bias the mixer which provides a stable mixer bias voltage. The active load circuit does not act as an intermediate frequency (IF) amplifier, requiring additional circuitry and increased power dissipation.

Figure 5:
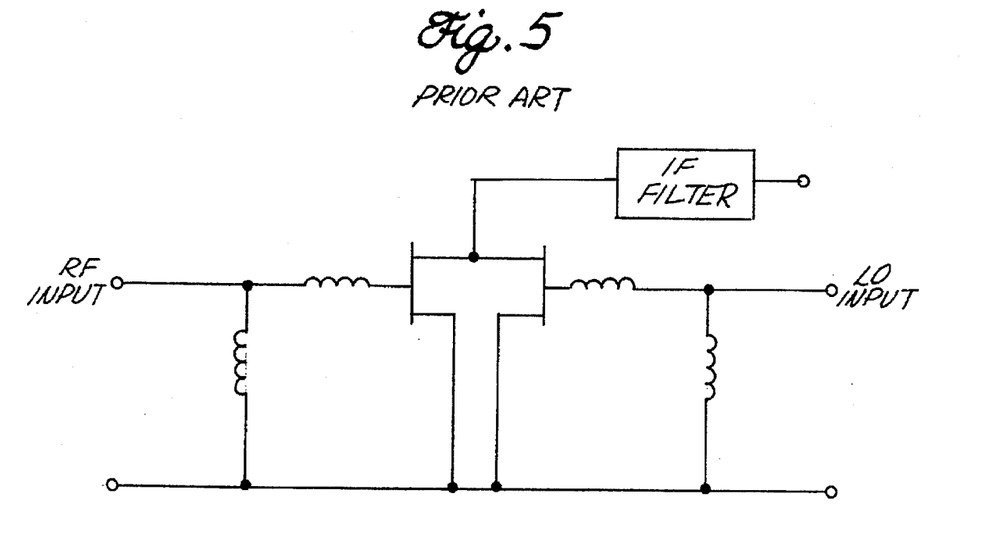

Another configuration, as illustrated in FIG. 5, connects the local oscillator amplifier in parallel with the mixer so that the sources and drains are common. There is no known teaching of how to bias the mixer. Assuming the bias is provided through the IF filter, there is no suggestion that the bias voltage is provided by the IF amplifier circuit.

SUMMARY OF THE INVENTION

One embodiment of the present invention allows a reduction in the cost of the MMIC by skillfully combining the active load and amplifier circuits. The resulting improvement is a MMIC downconverter that simultaneously provides a stable mixer bias voltage and intermediate frequency amplification. By integrating the implementation of the active load and amplifier circuits, the device is smaller and more power efficient than competitive devices.

An embodiment of the invention is a monolithic microwave integrated circuit (MMIC) downconverter for a direct broadcast satellite low noise block downconverter. The MMIC comprises a mixer circuit that combines a local oscillator signal with a radio frequency input to produce sum and difference frequency signals. An intermediate frequency signal (the difference signal) is selected by a low pass filter coupled to the mixer circuit. An active load and amplifier circuit provides the mixer circuit with a DC bias voltage that is substantially insensitive to DC current. The active load and amplifier circuit simultaneously amplifies the intermediate frequency signal from the low pass filter for an output signal of the MMiC.

DESCRIPTION OF THE PREFERRED EMBODIMENT

Figure 1:
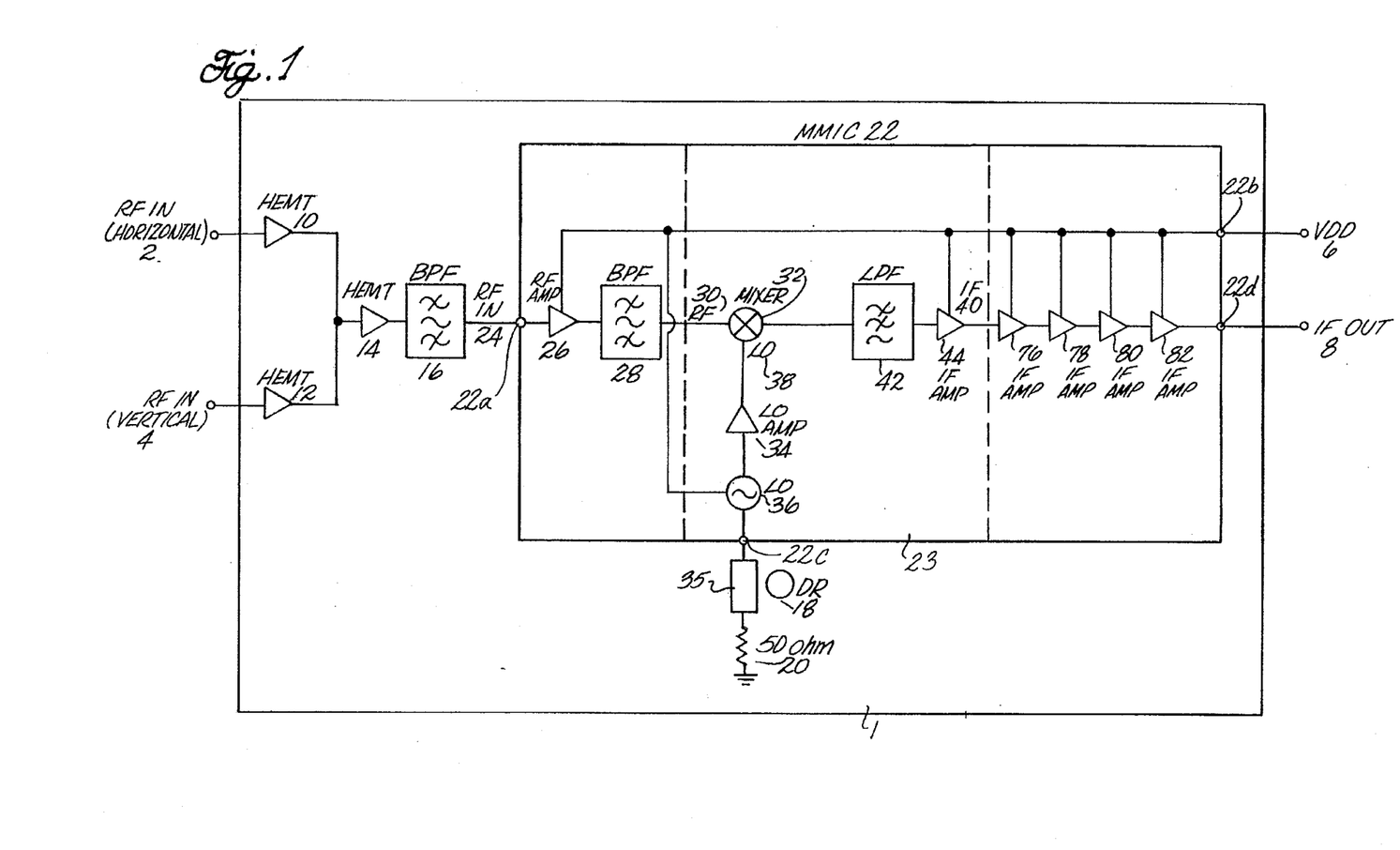
FIG. 1 is a block diagram of a Low Noise Block Downconverter system and embodies the present invention.

FIG. 1 illustrates a block diagram of a Low Noise Block (LNB) Downconverter 1 for use in a Direct Broadcast Satellite (DBS) receiver system. The radio frequency (RF) input is received by an antenna or dish (not shown) from a satellite transmission. The RF input may be horizontally polarized, RF IN (Horizontal) 2, or vertically polarized, RF IN (Vertical) 4, depending on the broadcast channel to which the television is tuned. The LNB Downconverter 1 is mounted on the antenna. It converts the received RF signal frequency from approximately 11 GHz to 12 GHz to an intermediate frequency of approximately 1000 MHz and amplifies the signal for processing by receiver electronics (not shown) inside, for example, the home.

The RF IN (Horizontal) 2 or RF IN (Vertical) 4 are received by high electron mobility transistors (HEMTs), HEMT 10 and HEMT 12 respectively, for amplification of the signal. The HEMTs provide high frequency, low noise amplification of the RF signals. The amplified RF IN (Horizontal) 2 or RF IN (Vertical) 4 signal is further amplified by HEMT 14. The amplified RF signal is filtered by the BPF 16, an image-reject band pass filter, to remove unwanted signals from other sources or noise produced by the HEMTs outside of the RF signal frequency band. The output, RF IN 24, is input to the MMIC 22 for downconversion to an intermediate frequency (IF) signal, IF OUT 8, for processing by the receiver electronics.

The MMIC 22 receives the RF IN 24 and amplifies the signal in the RF AMP 26. The amplified RF signal is filtered in the BPF 28, an image-reject band pass filter, to reduce noise produced by the RF AMP 26 in the image band. The filtered RF signal, RF 30, is input to the mixer 32 where it is combined with local oscillator signal, LO 38, to produce sum and difference frequency signals of the RF 30 and LO 38 signals. The LPF 42, a low pass filter, selects an intermediate frequency signal, which is the difference signal, and provides it to IF amplifier, IF AMP 44. Amplified intermediate frequency signal, IF 40, is further amplified in four additional amplifier stages with the MMIC 22 comprising IF AMP 76, IF AMP 78, IF AMP 80, and IF AMP 82. The amplified signal, IF OUT 8, is then output to a television or VCR receiver electronics for processing.

Figure 2:
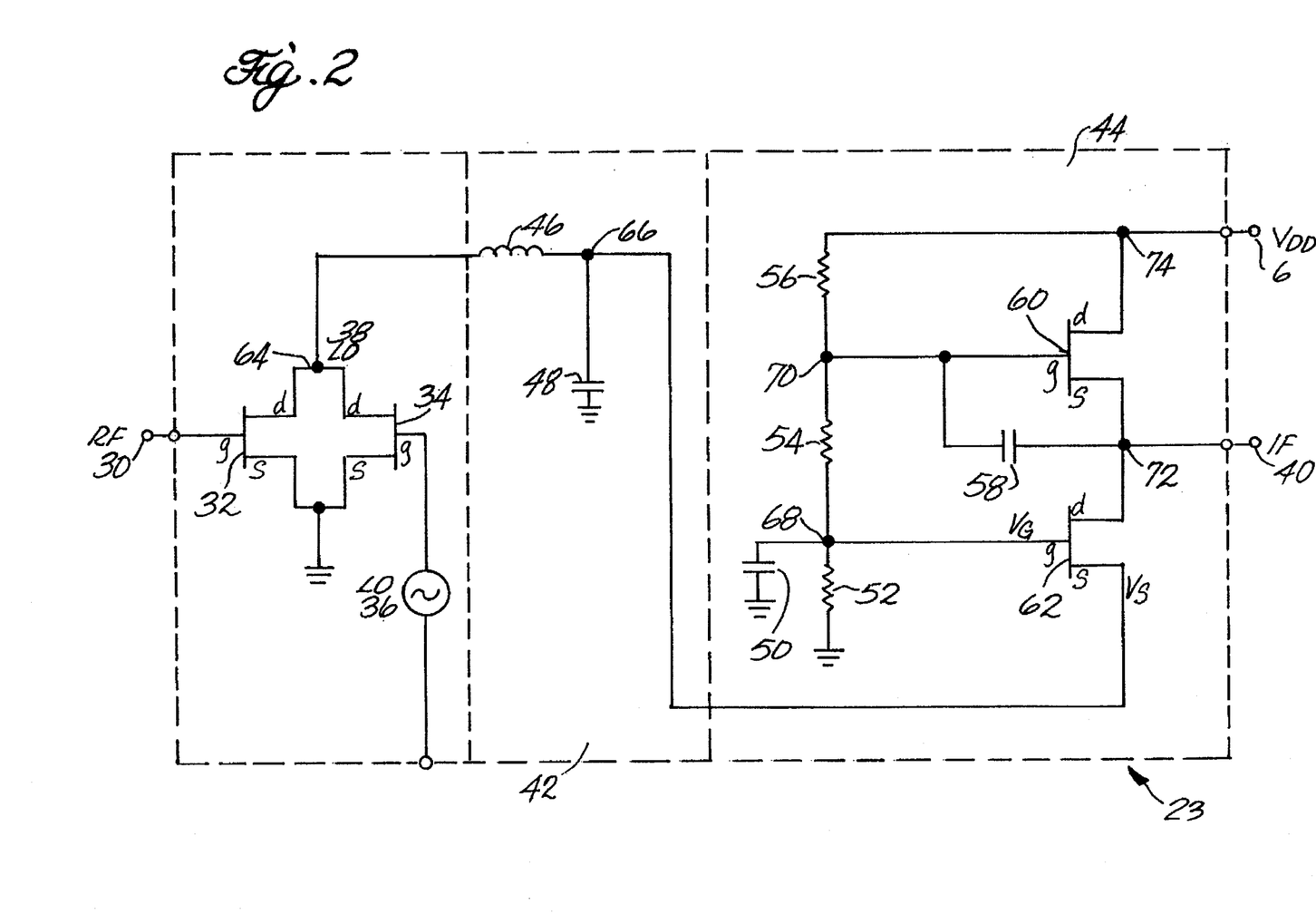
FIG. 2 depicts the portion of the monolithic microwave integrated circuit at 23 in FIG. 1 and embodies the present invention.

FIG. 2 illustrates portion 23 of the MMIC 22 and is referenced in the following discussion.

The mixer 32 is a single gate field effect transistor (FET). The RF signal 30, having a frequency range by way of example of 10.7 GHz to 11.8 GHz, is input to the gate, g, of mixer FET 32. The local oscillator (LO) signal 36, having a frequency by way of example of 9.75 GHz, is connected to the gate, g, of FET 34 which produces an amplified local oscillator (LO) signal, 38, at the drain, d, of the mixer FET 32 at 64. The sources of FETs 32 and 34 are connected to ground. In this configuration, the nonlinear drain resistance of FET 32 is used as the primary mixing element. A spectrum of frequencies from the sum and difference of the RF signal 30 and LO signal 38 and harmonics are generated at the output of the mixer 32 at 64.

The low pass filter, LPF 42, is implemented using a series inductor 46 and shunt capacitor 48. The sum and difference signals from the mixer 32 are received by the inductor 46 of the low pass filter 42. The filter 42 attenuates all but the difference frequencies to provide an intermediate frequency signal by way of example of 950 MHz to 2050 MHz.

The IF amplifier 44 amplifies the intermediate frequency signal and operates as an active load for the mixer. The FET 62 is configured as a common gate amplifier with its gate, g, grounded through capacitor 50. The IF signal from the low pass filter 42 is received on the source, s, of the FET 62. FET 60 operates as an active load for the amplifier FET 62. Capacitor 58 and resistor 56 connected between power source VDD 6 and the gate, g, of FET 62 serve to compensate the frequency response of the active load circuit as described in the article *WIDEBAND HIGH GAIN SMALL SIZE MONOLITHIC GaAs FET AMPLIFIERS* by Vlad Pauker and Michel Binet (CH1875-4/83/0000-0081, 1983 IEEE). The amplified IF signal, IF 40, is output from the drain of the FET 62 and applied to the four cascaded amplifier stages IF AMP 76, IF AMP 78, IF AMP 80, and IF AMP 82 for additional amplification. The resulting signal, IF OUT 8, is applied to the output terminal of the MMIC 22.

The IF amplifier 44 also establishes a bias voltage on the drain of the mixer FET 32. The voltage by way of example of 1.0 volt was experimentally determined to be an optimum for mixer operation. A voltage divider comprised of resistor 52, resistor 54, and resistor 56 serially connected between supply voltage VDD 6 and ground receives the bias supply voltage, VDD 6, from the input of the MMIC 22 at 74 and establishes a bias voltage, VG, relative to ground on the gate, g, of FET 62 at the junction of resistors 52 and 54 determined by the equation R52/(R52+R54+R56)*VDD 6, which is by way of example 0.7 volt. The gate, g, to source, s, voltage, VGS, of the FET 62 varies with the drain to source current, IDS, through the FET 62, however, the variation is relatively small. The voltage, VS, on the source, s, of the FET 62 is equal to the sum of the gate voltage, VG, and the magnitude of the gate to source voltage, VGS, or VG+|VGS|. Since VGS is by way of example −0.3 volt, the source voltage, VS, of the FET 62 is approximately 1.0 volt. The source, s, of the FET 62 is connected to the drain, d, of the mixer FET 32. The source voltage, VS, is therefore the bias voltage of the mixer FET 32 and is substantially insensitive to DC current. Since the DC current of the mixer 32 varies when the local oscillator signal, LO 38, power is applied and also due to variations in the implementation process, it is necessary for the active load and amplifier 44 to supply the proper bias voltage with low sensitivity to the DC current.

As previously described, the amplified local oscillator signal, LO 38, having a frequency of preferably 9.75 GHz is applied to the drain of the mixer FET 32 to be combined with the RF signal 30. The LO signal 38 is generated by a local oscillator 36 and amplified by the LO amplifier FET, LO AMP 34, in the MMIC 22. A dielectric resonator 18, external to the MMIC 22, is coupled to the local oscillator 36 via a transmission line 35 as shown in FIG. 1. The dielectric resonator 18 stabilizes the local oscillator 36 to a fixed frequency of preferably 9.75 GHz. The 50 ohm termination resistor 20 prevents unwanted oscillations at other frequencies.

The MMIC 22 of FIG. 1 is fabricated from Gallium Arsenide, GaAs, and assembled into a single package with input terminals 22a for the radio frequency signal RF IN 24, 22b for the bias supply VDD 6, 22c for the input to the local oscillator, 22d for the intermediate frequency output signal IF OUT 8, and four ground terminals (not shown, but depicted by ground symbols). The bias supply input terminal is connected to the active load and amplifier circuit IF AMP 44, the RF AMP 26, the LO 36, and the IF signal amplifiers IF AMP 76, IF AMP 78, IF AMP 80, and IF AMP 82 for supplying the DC bias voltage.

While the invention has been described and an embodiment disclosed, it is anticipated that other modifications and adaptations will occur to those skilled in the art without departing from the scope of the invention. It is intended therefore that the invention be limited only by the claims appended hereto. The frequency, voltage and other values given in the disclosure are by way of example and may be varied within the scope of the invention. Although the word connected is used to refer to the connection of two components, when a connection is recited there may be one or more components in between those connected.

What is claimed is:

1. A monolithic microwave integrated circuit (MMIC) downconverter for providing lower frequency output signals derived from radio frequency input signals, comprising:

a mixer circuit for producing sum and difference frequency signals from an oscillator signal and a radio frequency signal from the input signals;

a low pass filter for selecting an intermediate frequency signal from one of the sum and difference frequency signals; and an active load and amplifier circuit for amplifying the intermediate frequency signal for the output signal, the active load and amplifier circuit providing both a DC bias current passing through the active load and amplifier and the mixer circuit and a DC bias voltage to the mixer circuit while maintaining the DC bias voltage substantially insensitive to the DC current through the active load and amplifier circuit.

2. The MMIC of claim 1 wherein the MMIC is assembled into a single package comprising an input terminal connected to the mixer circuit, an output terminal connected to the active load and amplifier circuit and a bias supply input terminal connected to the active load and amplifier circuit.

3. The MMIC of claim 2 comprising an amplifier and filter connected between the input terminal and the mixer circuit.

4. The MMIC of claim 2 comprising at least one amplifier connected between the active load and amplifier circuit and the output terminal.

5. The MMIC of claim 2 comprising at least one further input terminal for receiving a frequency signal and a local oscillator coupled between the further input terminal and the low pass filter.

6. The MMIC of claim 1 wherein the active load and amplifier circuit comprises a transistor for amplifying the intermediate frequency signal and through which the DC current flows.

7. A monolithic microwave integrated circuit (MMIC) downconverter for providing lower frequency output signals derived from radio frequency input signals, comprising:

a mixer circuit for producing sum and difference frequency signals from an oscillator signal and a radio frequency signal from the input signals;

a low pass filter for selecting an intermediate frequency signal from one of the sum and difference frequency signals; and an active load and amplifier circuit connected to the low pass filter for both providing to the mixer circuit a DC bias voltage, substantially insensitive to DC current through the active load and amplifier circuit, and for amplifying the intermediate frequency signal for the output signals, wherein the MMIC is assembled into a single integrated circuit package comprising an input terminal for the input signals, an output terminal for the output signals and a bias supply input terminal for receiving and providing a DC bias voltage to the active load and amplifier circuit, and wherein the active load and amplifier circuit comprises first and second FETs, first and second capacitors, and first, second and third resistors with the first FET, configured as a common gate amplifier, the first FET, comprising:

a source connected to the output of the low pass filter;

a gate connected to a first side of the first capacitor, a first side of the first resistor, and a second side of the second resistor; and a drain connected to a second side of the second capacitor and the output terminal of the MMIC;

the second FET, operating as an active load, the second FET comprising:

a source connected to the drain of the first FET, the second side of the second capacitor, and the output terminal of the MMIC;

a gate connected to a first side of the second capacitor, a first side of the second resistor, and a second side of the third resistor; and a drain connected to a first side of the third resistor and the bias supply input terminal;

a second side of the first capacitor connected to ground; and a second side of the first resistor connected to ground, wherein the mixer circuit comprises a field effect transistor (FET), comprising:

a gate connected for receipt of the radio frequency signal;

a source connected to a reference potential; and a drain connected for receiving the oscillator signal and to the low pass filter, and wherein the low pass filter comprises an inductor and a capacitor with a first side of the inductor located at an input of the low pass filter, a second side of the inductor connected to a first side of the capacitor, a second side of the capacitor connected to ground and the connection of the second side of the inductor and the first side of the capacitor located at an output of the low pass filter.

8. The MMIC of claim 7 wherein the MMIC is fabricated from Gallium Arsenide.

9. The MMIC of claim 7 further comprising:

a local oscillator adapted to be stabilized by an external dielectric resonator, for providing the oscillator signal;

a first amplifier for amplifying the oscillator signal and for providing the amplified oscillator signal to the mixer circuit;

a second amplifier connected to the input terminal for amplifying radio frequency signals in the input signal;

an image reject band pass filter connected to the second amplifier for filtering the amplified radio frequency input signals for the mixer circuit; and a plurality of cascaded amplifier stages connected to an output of the active load and amplifier circuit for amplifying the intermediate frequency signal from the active load and amplifier circuit for the output signals.

10. A monolithic microwave integrated circuit (MMIC) downconverter for providing lower frequency output signals derived from radio frequency input signals, comprising:

a mixer circuit for producing sum and difference frequency signals from an oscillator signal and a radio frequency signals from the input signals;

a low pass filter for selecting an intermediate frequency signal from one of the sum and difference frequency signals; and an active load and amplifier circuit connected to the low pass filter for both providing to the mixer circuit a DC bias voltage, substantially insensitive to DC current through the active load and amplifier circuit, and for amplifying the intermediate frequency signal for the output signals, wherein the activate load and amplifier circuit comprises:

an input terminal for receiving a bias supply voltage;

a field effect transistor (FET) comprising a gate, a source and a drain one of which is connected to the mixer circuit and the other of which is connected to an output for the output signals for the MMIC; and a voltage divider connected for receiving the bias supply voltage from the input terminal and for applying a bias voltage at the gate of the FET.

11. The MMIC of claim 10 wherein the voltage divider and the FET establish a bias voltage at the source of the FET substantially insensitive to DC current and equal to a sum of the bias voltage at the gate of the FET and a magnitude of a voltage from the gate to source of the FET.

12. The MMIC of claim 11 comprising a resistor capacitor circuit between the input terminal and the FET to compensate the frequency response of the active load.

13. A low noise block (LNB) downconverter for a direct broadcast satellite, comprising:

first and second high electron mobility transistors (HEMTs) for receiving, amplifying, and switching between received horizontal and vertical radio frequency input signals;

a third HEMT connected to the first and second HEMTs for additional amplification of the amplified horizontal or vertical radio frequency input signals;

an image reject band pass filter (BPF) connected to the third HEMT for filtering the amplified horizontal or vertical radio frequency input signals to produce a radio frequency input (RF) signal in a desired frequency band; and a monolithic microwave integrated circuit (MMIC) connected for receiving the RF signal, comprising:

a mixer circuit producing sum and difference frequency signals from an oscillator signal and the RF signal;

a low pass filter coupled to the mixer circuit for selecting an intermediate frequency signal from the sum and the difference frequency signals; and an active load and amplifier circuit for amplifying the intermediate frequency signal, the active load and amplifier circuit providing both a DC bias current through the active load and amplifier circuit and the mixer circuit and a DC bias voltage to the mixer circuit, while maintaining the DC bias voltage substantially insensitive to the DC current through the active load and amplifier circuit.

14. The low noise block downconverter of claim 13 wherein the MMIC further comprises:

a radio frequency input;

a local oscillator (LO), stabilized by a dielectric resonator, providing a local oscillator signal;

a first amplifier connected to the LO for amplifying the local oscillator signal for the mixer circuit ;

a second amplifier connected to the radio frequency input for amplifying a radio frequency input signal to the MMIC;

an image reject band pass filter connected to the second amplifier for filtering the amplified radio frequency input signal for the mixer circuit; and four cascaded amplifier stages connected to an output of the active load and amplifier circuit for amplifying the intermediate frequency signal from the active load and amplifier circuit for an output signal of the MMIC.

15. The low noise block downconverter of claim 13 wherein the active load and amplifier circuit comprises a transistor for amplifying the intermediate frequency signal and through which the DC current flows.

16. A method of downconverting a radio frequency signal to an intermediate frequency signal, comprising:

mixing an oscillator signal and the radio frequency signals to produce sum and difference frequency intermediate frequency signals with a mixer;

low pass filtering the intermediate frequency signal with a low pass filter from the sum and difference frequency intermediate frequency signals; and both amplifying the filtered intermediate frequency signals, and providing a DC bias voltage to the mixer with an active load and amplifier which passes DC current to the mixer while maintaining the bias voltage to the mixer substantially insensitive to the DC current through the active load and amplifier.

17. The method of claim 16 wherein the step of amplifying and providing a DC bias voltage comprises amplifying the filtered intermediate frequency signals and applying the bias voltage with a field effect transistor (FET).

18. A method of downconverting a radio frequency signal to an intermediate frequency signal, comprising:

mixing an oscillator signal and the radio frequency signals to product sum and difference frequency intermediate frequency signals with a mixer circuit;

low pass filtering the intermediate frequency signal with a low pass filter from the sum and difference frequency intermediate frequency signals;

amplifying the filtered intermediate frequency signals;

providing a DC bias signal, substantially insensitive to DC current, through the low pass filter to the mixer circuit, applying a DC supply voltage to a voltage divider for dividing the DC supply voltage; and applying the divided DC supply voltage to a gate of the FET which establishes a DC bias voltage on the source of the FET equal to a sum of the divided DC supply voltage and a magnitude of a gate to source voltage of the FET, and that is substantially insensitive to DC current through the FET, wherein the step of amplifying and providing a DC bias voltage comprises amplifying the filtered intermediate frequency signals and applying the DC bias signal with a field effect transistor (FET).

19. A monolithic microwave integrated circuit (MMIC) downconverter for providing lower frequency output signals derived from radio frequency input signals, comprising:

a mixer circuit for producing sum and difference frequency signals from an oscillator signal and a radio frequency signals from the input signals;

a low pass filter for selecting an intermediate frequency signal from one of the sum and difference frequency signals; and an active load and amplifier circuit connected to the low pass filter for both providing to the mixer circuit a DC bias voltage, substantially insensitive to DC current through the active load and amplifier circuit, and for amplifying the intermediate frequency signal for the output signals, wherein the MMIC is assembled into a single integrated circuit package comprising an input terminal for the input signals, an output terminal for the output signals and a bias supply input terminal for receiving and providing a DC bias voltage to the active load and amplifier circuit, and wherein the active load and amplifier circuit comprises first and second FETs, first and second capacitors, and first, second and third resistors with:

the first FET, configured as a common gate amplifier, the first FET, comprising:

a source connected to the output of the low pass filter;

a gate connected to a first side of the first capacitor, a first side of the first resistor, and a second side of the second resistor; and a drain connected to a second side of the second capacitor and the output terminal of the MMIC;

the second FET, operating as an active load, the second FET comprising:

a source connected to the drain of the first oFET, the second side of the second capacitor, and the output terminal of the MMIC;

a gate connected to a first side of the second capacitor, a first side of the second resistor, and a second side of the third resistor; and a drain connected to a first side of the third resistor and the bias supply input terminal;

a second side of the first capacitor connected to ground; and a second side of the first resistor connected to ground.

\* \* \* \* \*

UNITED STATES PATENT AND TRADEMARK OFFICE
CERTIFICATE OF CORRECTION

PATENT NO. : 5,649,312
DATED : July 15, 1997
INVENTOR(S) : Wayne Kennan

It is certified that error appears in the above-indentified patent and that said Letters Patent is hereby corrected as shown below:

Abstract, line 14, change "MMiC" to -- MMIC --.
Column 2, line 18, change "MMiC" to -- MMIC --.
Column 6, line 26, change "signals" to -- signal --.
Column 7, line 61, change "product" to -- produce --.
Column 8, line 22, change "signals" to -- signal --.
Column 8, line 52, replace "oFET" with -- FET --.

Signed and Sealed this

Eighth Day of September, 1998

Attest:

BRUCE LEHMAN

*Attesting Officer*　　　　*Commissioner of Patents and Trademarks*